United States Patent
Najafi et al.

(10) Patent No.: US 11,027,479 B2
(45) Date of Patent: Jun. 8, 2021

(54) THERMAL CONTROL MOLD FOR MAKING THREE-DIMENSIONAL MICROSTRUCTURES

(71) Applicant: THE REGENTS OF THE UNIVERSITY OF MICHIGAN, Ann Arbor, MI (US)

(72) Inventors: Khalil Najafi, Ann Arbor, MI (US); Jae Yoong Cho, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 261 days.

(21) Appl. No.: 15/711,254

(22) Filed: Sep. 21, 2017

(65) Prior Publication Data
US 2018/0079129 A1   Mar. 22, 2018

Related U.S. Application Data

(60) Provisional application No. 62/397,402, filed on Sep. 21, 2016.

(51) Int. Cl.
*B29C 51/36* (2006.01)
*B29C 51/42* (2006.01)
(Continued)

(52) U.S. Cl.
CPC ............ *B29C 51/36* (2013.01); *B29C 51/421* (2013.01); *B29C 51/428* (2013.01);
(Continued)

(58) Field of Classification Search
CPC ......... B29C 51/36; B29C 51/10; B29C 51/42; B29C 51/421; G01C 19/5691; G01P 9/04
See application file for complete search history.

(56) References Cited

U.S. PATENT DOCUMENTS

| 1,903,593 A | 4/1933 | Martin |
| 7,694,531 B2 | 4/2010 | Eklund et al. |

(Continued)

FOREIGN PATENT DOCUMENTS

WO   WO-2013067023 A1   5/2013

OTHER PUBLICATIONS

Conduction heat transfer solutions by James VanSant, Steady heat-transfer in pipe wall in p. 17 Publisher: Lawrence Livermore National Laboratory; UCRL-52863 (Year: 1980).*

(Continued)

*Primary Examiner* — Matthew J Daniels
*Assistant Examiner* — Shibin Liang
(74) *Attorney, Agent, or Firm* — Harness, Dickey & Pierce, P.L.C.

(57) ABSTRACT

Methods for fabricating three-dimensional microstructures are provided. The method includes disposing a reflow material on a mold, heating the reflow material, and creating a pressure gradient across the reflow material to reflow the material towards a bottom surface of the mold. The mold includes a molding region, a boundary region, and a thermal-isolating region disposed therebetween. The molding region includes a cavity and a projection projecting upwards from a bottom surface of the cavity. The thermal-isolating region includes at least one pocket formed adjacent to and along a perimeter of the cavity of the molding region. During heating, the temperature of the molding region is higher than that of the boundary region and the thermal-isolating region controls the thermal conductivity and mass therebetween. The material reflows towards the bottom surface of the cavity and the protrusion helps shapes the reflow material to form a substantially symmetrical three-dimensional microstructure.

20 Claims, 11 Drawing Sheets

(51) Int. Cl.
*B81C 99/00* (2010.01)
*B29C 51/10* (2006.01)
*B29L 31/00* (2006.01)
*G01C 19/5691* (2012.01)
*B81C 1/00* (2006.01)
*B29L 31/34* (2006.01)

(52) U.S. Cl.
CPC ........ *B81C 99/009* (2013.01); *B81C 99/0085* (2013.01); *B29C 51/10* (2013.01); *B29L 2031/34* (2013.01); *B29L 2031/752* (2013.01); *B81C 1/00634* (2013.01); *G01C 19/5691* (2013.01)

(56) References Cited

U.S. PATENT DOCUMENTS

| | | | |
|---|---|---|---|
| 8,109,145 | B2 | 2/2012 | Stewart |
| 8,151,600 | B2 | 4/2012 | Eklund et al. |
| 8,567,247 | B2 | 10/2013 | Shkel et al. |
| 8,631,702 | B2 * | 1/2014 | Horning ............. G01C 19/5691 |
| | | | 73/504.13 |
| 9,796,586 | B2 * | 10/2017 | Najafi ..................... C03B 23/02 |
| 2005/0257568 | A1 | 11/2005 | Taft et al. |
| 2010/0000259 | A1 | 1/2010 | Ukrainczyk et al. |
| 2012/0144866 | A1 | 6/2012 | Liu et al. |
| 2013/0081428 | A1 | 4/2013 | Liu et al. |
| 2013/0160578 | A1 | 6/2013 | Najafi et al. |
| 2016/0194200 | A1 | 7/2016 | Najafi et al. |

OTHER PUBLICATIONS

J. Cho et al's "High-Q Fused Silica Birdbath and Hemispherical 3-D Resonators Made by Blow Torch Molding", IEEE (2013).

D. Senkal et al's "MEMS Micro-Glassblowing Paradigm for Wafer-Level Fabrication of Fused Silica Wineglass Gyroscopes" Procedia Engineering 87, pp. 1489-1492 (2014).

J. Cho et al's "3-D Dimensional Blow Torch-Molding of Fused Silica Microstructures" Journal of Microelectromechanical Systems, vol. 22, No. 6 (2013).

* cited by examiner

THERMAL CONTROL MOLD FOR MAKING THREE-DIMENSIONAL MICROSTRUCTURES

CROSS-REFERENCE TO RELATED APPLICATIONS

This application claims the benefit of U.S. Provisional Application No. 62/397,402, filed on Sep. 21, 2016. The entire disclosure of the above application is incorporated herein by reference.

GOVERNMENT CLAUSE

This invention was made with government support under grant number W31P4Q-11-1-0002 awarded by the Department of Defense/Defense Advanced Research Projects Agency (DARPA). The government has certain rights in the invention.

FIELD

The present disclosure relates to three-dimensional (3-D) microstructures and fabrication processes thereof.

BACKGROUND

Micro-scale three-dimensional (3-D) shell structures have applications in a variety of areas such as inertial sensors, chemical sensors, biological sensors, and optical components. For example, micro-scale three-dimensional (3-D) shell structures play an important role in the instances of high-performance vibratory gyroscopes. A vibratory gyroscope is a sensor that measures angular speed and angular orientation and may be used in a variety of applications, such as an inertial measurement unit (IMU) for autonomous cars, drones, space satellites, and airplanes in GPS-denied environments.

A vibratory gyroscope comprises a vibratory resonator and electrodes configured to actuate and sense the motion of the vibratory resonator. The performance of the vibratory gyroscope, including accuracy and resolution, is heavily dependent on the quality and symmetry of a resonator. For a vibratory gyroscope to obtain high performance, the vibratory resonator comprising the vibratory gyroscope should have a comparatively high mechanical quality factor (Q) and substantial mechanical symmetry. In particular, stiffness and damping constants of the vibratory resonator should be the same along all directions perpendicular to a sensing axis of the vibratory gyroscope. An axisymmetric vibratory resonator comprising materials having low internal energy loss, such as fused silica, is attractive due to its excellent mechanical quality factor (Q) and high structural symmetry. However, such materials, such as fused silica, may be difficult to machine using conventional micromachining techniques.

A hemispherical resonator gyroscope (HRG) comprises an axisymmetric shell resonator having a comparatively high mechanical quality factor (Q). The hemispherical resonator gyroscope (HRG) resonator comprises fused silica and has a shape resembling a wineglass (size ~30 cc). To achieve an improved high mechanical quality factor (Q) (e.g., ~20 million) and substantially perfect structural symmetry, the hemispherical resonator gyroscope (HRG) resonator is manufactured using precision grinding and polishing processes. However, such manufacturing processes are expensive (>$100,000/unit), slow, and inaccurate for making micro-scale (<1cc) structures. To overcome these challenges, micro-electromechanical system (MEMS) fabrication processes have been used to fabricate micro-scale axisymmetric shell resonators. A micro-electromechanical system (MEMS) process can form highly accurate components at a low cost. However, conventional micro-electromechanical system (MEMS) processes have some disadvantages, such as a limited number of available materials, difficulty in depositing films or substrates with large thicknesses, and forming components with high surface roughness.

Three-dimensional (3D) micro-reflowing molding processes provide an attractive alternative. However, three-dimensional (3D) micro-reflowing molding is disadvantaged by dependency on temperature uniformity of the mold and the temperature uniformity of a heating source. More particularly, the uniform distribution of heat from the heat source is dependent on the alignment of the heat source with the mold and the symmetry of the mold itself. Most of the available heating sources (e.g., blowtorch, laser, plasma torch, induction heating) have a fairly non-uniform temperature distribution profile in the radial direction with respect to their center axes. In some instances, uniform heating of the mold can be achieved when a heating source is aligned accurately with the center of the mold. However, the alignment accuracy for achieving the level of symmetry from a reflow molded shell for high-value applications, such as a high-performance vibratory gyroscope, is extremely high (e.g., better than 5 μm). This level of accuracy is comparable with a lithography process and is difficult to obtain using a low-cost fabrication setup. A furnace could be used to uniformly heat the mold. However, it is difficult to apply a large enough pressure gradient for deforming a substrate and to rapidly cool a reflowed shell to prevent the shape of the shell from deviating in a furnace environment.

Further, it is difficult to precisely control the temperature of the mold during the reflow process, in part, because of the time required for the mold temperature to reach a steady state (e.g., thermal response time). Such complicates the temperature control of the reflow molding process because the temperature of the mold changes while the substrate is being reflowed. A poorly controlled molding temperature causes shells to have large variations in their sizes and mechanical properties. Thus, there remains a need for micro-fabrication techniques to fabricate three-dimensional (3D) micro-sensors with reflowable materials having good accuracy.

This section provides background information related to the present disclosure, which is not necessarily prior art.

SUMMARY

This section provides a general summary of the disclosure, and is not a comprehensive disclosure of its full scope or all of its features.

In various aspects, the present disclosure provides an exemplary method for fabricating three-dimensional microstructures. The method includes disposing a substantially planar reflow material on a mold having a molding region, a boundary region, and a thermal-isolating region disposed therebetween; heating the reflow material while the reflow material is disposed on the mold; and reflowing the reflow material. The molding region of the mold includes a cavity centered therein, and a protrusion projects upwards from a bottom surface of the cavity. The thermal-isolating region includes at least one pocket that is formed adjacent to and along a perimeter of the cavity of the molding region. The thermal-isolating region divides the thermal masses of the molding region and the boundary region and consequently during heating of the reflow material the molding region has a first temperature that is higher than a second temperature of the boundary region. The reflow material is reflowed towards the bottom surface of the cavity by creating a pressure gradient across the reflow material. The protrusion extending from the bottom surface of the cavity helps to shape the reflow material and thereby to form a three-dimensional microstructure.

In one variation, the formed three-dimensional microstructure has a diameter of equal to or less than about 120 cm.

In one variation, the thermal resistance within the at least one pocket of the thermal-isolating region is equal to or greater than the thermal resistance of the molding region.

In one variation, the thermal resistance of the thermal-isolating region is proportional to $$\frac{R_3 - R_2}{T - D_{recess2}},$$

where $R_3$ is an outer radius of the thermal-isolating region, $R_2$ is an inner radius of thermal-isolating region, T is a thickness of the mold, and $D_{recess2}$ is a depth of the at least one pocket of the thermal-isolating region.

In one variation, the mold has a geometrical relationship defined by one of $[(R_3-R_2)/(T-D_{recess2})]$, $[(R_2-R_1)/D_{recess1}]$, $[(R_2-R_1)/D_{recess2}]$, or a combination thereof, where $R_1$ is an outer radius of the cavity of the molding region, $R_2$ is an inner radius of thermal-isolating region, $R_3$ is an outer radius of the thermal-isolating region, $D_{recess1}$ is a depth of the cavity of the molding region, $D_{recess2}$ is a depth of the at least one pocket of the thermal-isolating region, and T is a thickness of the mold.

In one variation, the thermal mass of the molding region is proportional to $[(R_2-R_1)\times D_{recess1}]$ and $[(R_2-R_1)\times D_{recess2}]$, where $R_2$ is an inner radius of thermal-isolating region, $R_1$ is an outer radius of the cavity of the molding region, T is a thickness of the mold, $D_{recess1}$ is a depth of the cavity of the molding region, and $D_{recess2}$ is a depth of the at least one pocket of the thermal-isolating region.

In one variation, the thermal mass of the molding region is proportional to a thermal response time of the molding region.

In one variation, the at least one pocket of the thermal-isolating region is a ring shaped recess that surrounds the cavity of the molding region. The ring shaped recess has a first depth that is substantially equal to a second depth of the cavity.

In one variation, the at least one pocket of the thermal-isolating region has a first base surface at a first depth that is substantially equal to a second depth of the cavity and at least one through-hole extending through the first base surface and a second base surface of the mold.

In one variation, the at least one pocket of the thermal-isolating region includes an array of pockets that are distributed in a substantially uniformed manner around the cavity of the molding region.

In one variation, the at least one pocket of the thermal-isolating region includes an array of interdigitated pockets that are distributed in a substantially uniformed manner around the cavity of the molding region.

In one variation, the at least one pocket of the thermal-isolating region extends through a base surface of the mold.

In one variation, the method further includes controlling the pressure gradient across the reflow material independently from the heating of the reflow material.

In one variation, at least one through-hole extends from a bottom surface of the cavity through a base surface of the mold and the method further includes fluidly coupling the at least one through-hole to a pressure source.

In one variation, the molding region has a first temperature that is higher than a second temperature of the boundary region.

In other aspects, the present disclosure provides a thermal control reflow mold for fabricating three-dimensional microstructures. The thermal control reflow mold includes a first mold component having a first substantially planar surface opposing a second substantially planar surface and comprising a molding region having a cavity substantially centered therewithin and a pillar projecting upwards from a centered bottom surface of the cavity; a boundary region surrounding the molding region; and a thermal-isolating region disposed between the molding region and the boundary region and including at least one pocket formed adjacent to and along a perimeter of the cavity of the molding region and an interior border of the boundary region. The thermal-isolating region divides the thermal masses of the molding region and the boundary region.

In one variation, the at least one pocket of the thermal-isolating region is a ring shaped recess that surrounds the cavity of the molding region. The ring shaped recess has a first depth that is substantially equal to a second depth of the cavity.

In one variation, the at least one pocket of the thermal-isolating region has a first base surface at a first depth that is substantially equal to a second depth of the cavity and at least one through-hole extending through the first base surface and a second base surface of the mold.

In one variation, the at least one pocket of the thermal-isolating region includes an array of pockets that are distributed in a substantially uniformed manner around the cavity of the molding region.

In one variation, the at least one pocket of the thermal-isolating region includes an array of interdigitated pockets that are distributed in a substantially uniformed manner around the cavity of the molding region.

In one variation, the at least one pocket of the thermal-isolating region extends through a base surface of the mold.

In one variation, the thermal control reflow mold further comprises a second mold and a substrate to be molded is disposed between the first mold and the second mold.

In other aspects, the present disclosure provides a mold for fabricating three-dimensional microstructures. The mold includes a molding region having a cavity formed therewithin and a projection projecting upwards from a bottom surface of the cavity; a boundary region surrounding the molding region; and a thermal-isolating region disposed between the molding region and the boundary region and including at least one pocket formed adjacent to and along a perimeter of the cavity of the molding region. The molding region has a first temperature higher than a second temperature of the boundary region.

In one variation, the thermal-isolating region divides thermal masses of the molding region and the boundary region and controls varying thermal resistances therebetween.

In one variation, a thermal resistance of the thermal-isolating region is proportional to $$\frac{R_3 - R_2}{T - D_{recess2}},$$

where $R_3$ is an outer radius of the thermal-isolating region, $R_2$ is an inner radius of thermal-isolating region, T is a thickness of the mold, and $D_{recess2}$ is a depth of the at least one pocket of the thermal-isolating region.

In one variation, the mold has a geometrical relationship defined by one of $[(R_3-R_2)/(T-D_{recess2})]$, $[(R_2-R_1)/D_{recess1}]$, $[(R_2-R_1)/D_{recess2}]$, or a combination thereof, where $R_1$ is an outer radius of the cavity of the molding region, $R_2$ is an inner radius of thermal-isolating region, $R_3$ is an outer radius of the thermal-isolating region, $D_{recess1}$ is a depth of the cavity of the molding region, $D_{recess2}$ is a depth of the at least one pocket of the thermal-isolating region, and T is a thickness of the mold.

In one variation, a thermal mass of the molding region is proportional to $[(R_2-R_1) \times D_{recess1}]$ and $[(R_2-R_1) \times D_{recess2}]$, where $R_2$ is an inner radius of thermal-isolating region, $R_1$ is an outer radius of the cavity of the molding region, T is a thickness of the mold, $D_{recess1}$ is a depth of the cavity of the molding region, and $D_{recess2}$ is a depth of the at least one pocket of the thermal-isolating region.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2A is a top-down view of the reflow mold and FIG. 2B is a side-view of the reflow mold.

Figure 3A:
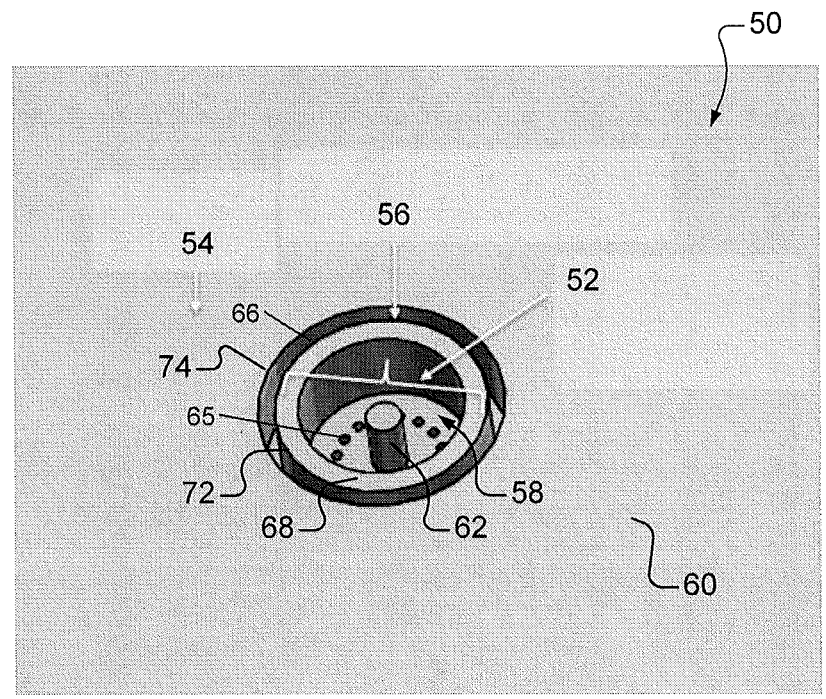
Figure 3B:
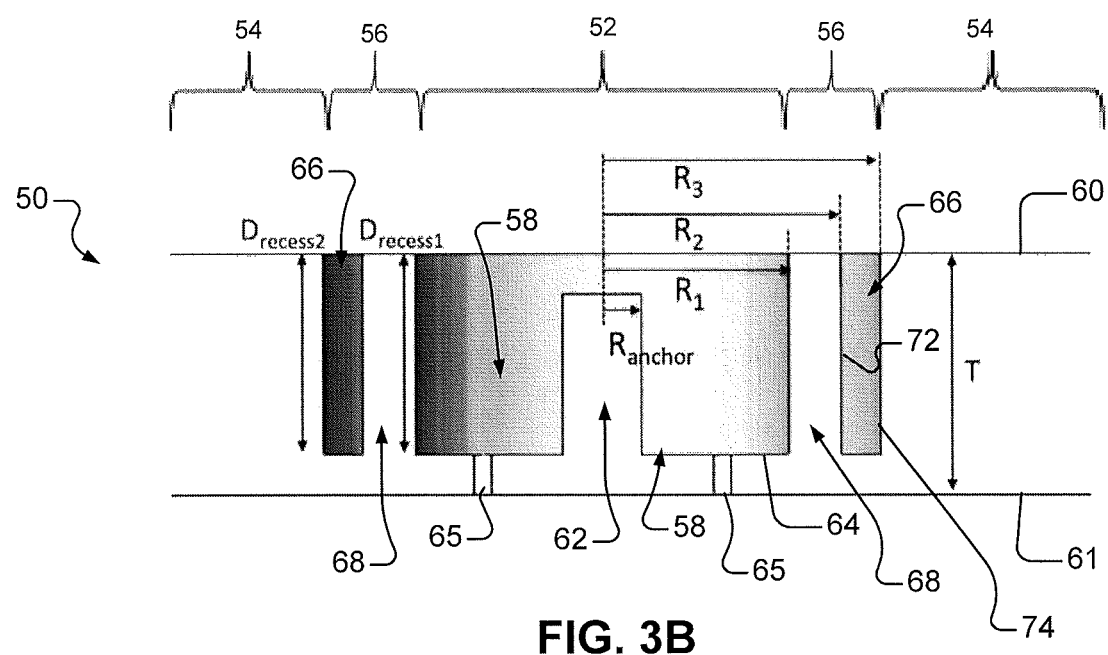
Figure 3C:
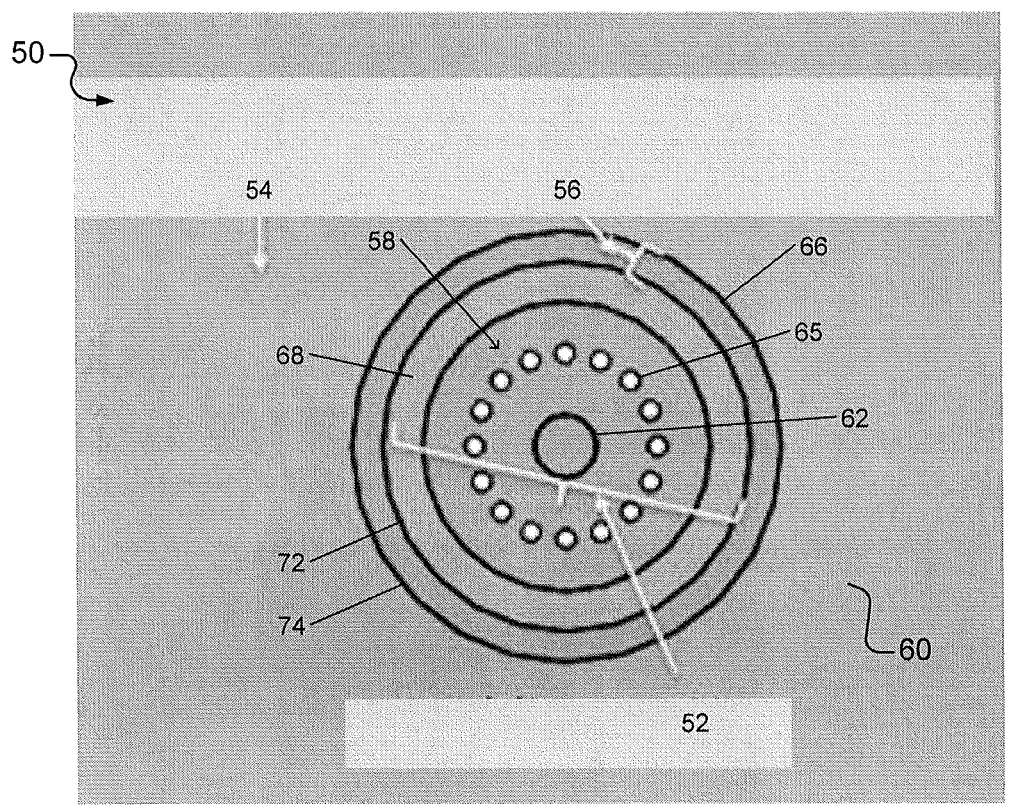

FIG. 3A-3C illustrates an example thermal control reflow mold for fabricating three-dimensional microstructures having a thermal-isolating region disposed between a molding region and a boundary region. FIG. 3A is a perspective view of the thermal control reflow mold; FIG. 3B is a side-view of the mold; and FIG. 3C is a top-down view of the mold.

Figure 4A:
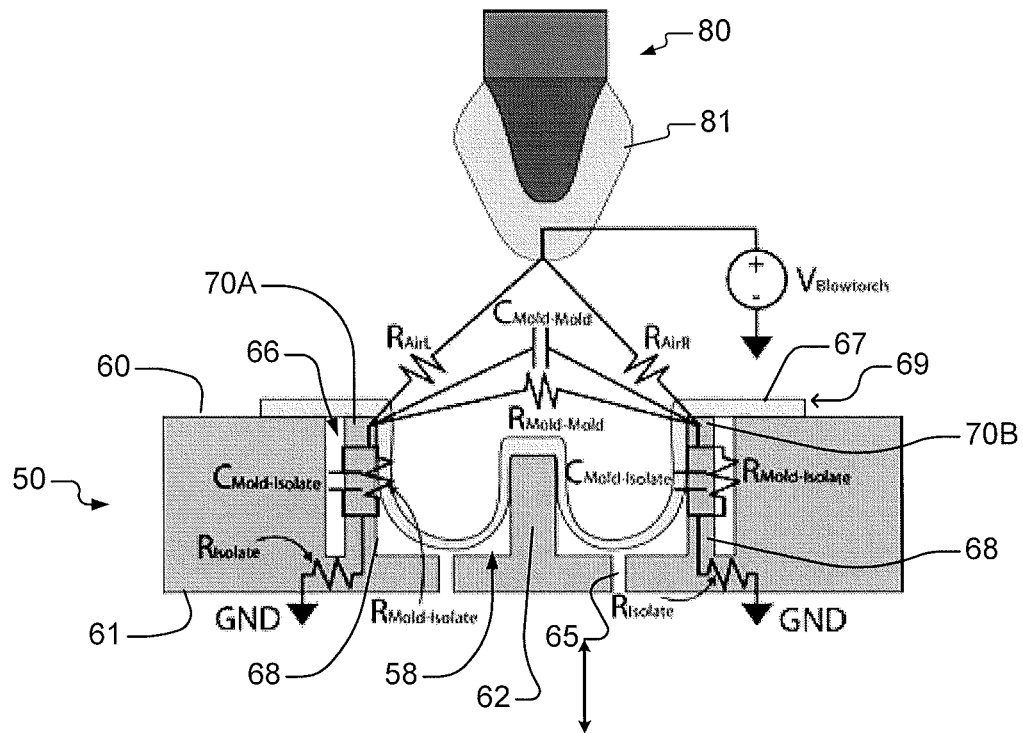

FIG. 4A illustrates an equivalent electrical circuit representation of the reflow molding process using the thermal control mold illustrated in FIGS. 3A-3B.

Figure 4B:
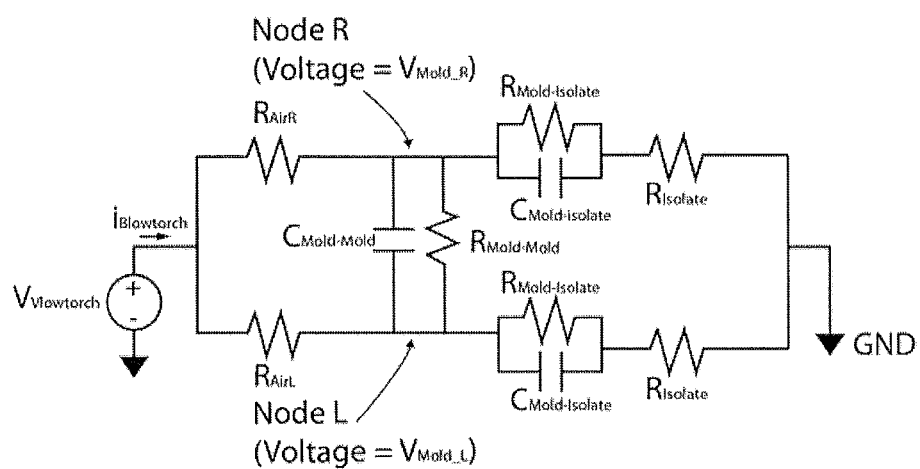

FIG. 4B illustrates the electrical circuitry of the equivalent electrical components of FIG. 4A.

Figure 5:
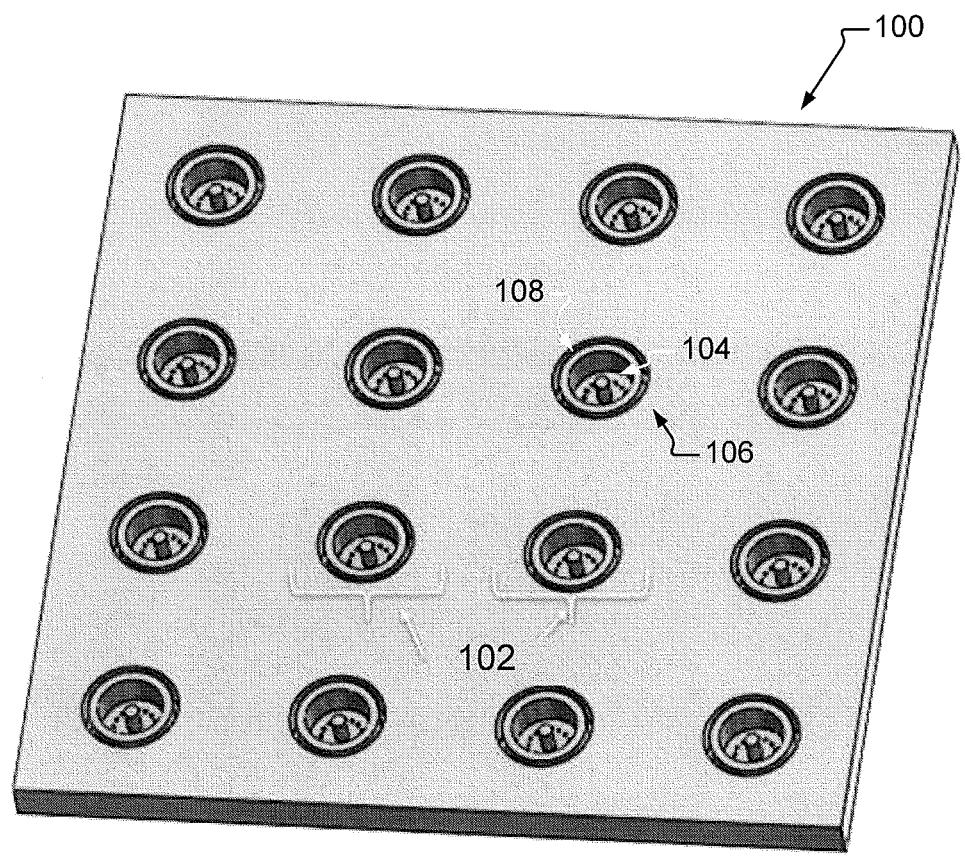

FIG. 5 illustrates a thermal control reflow mold having multiple sub-molds, where each sub-mold includes a molding region, a boundary region, and a thermal-isolating region disposed therebetween.

Figure 6A:
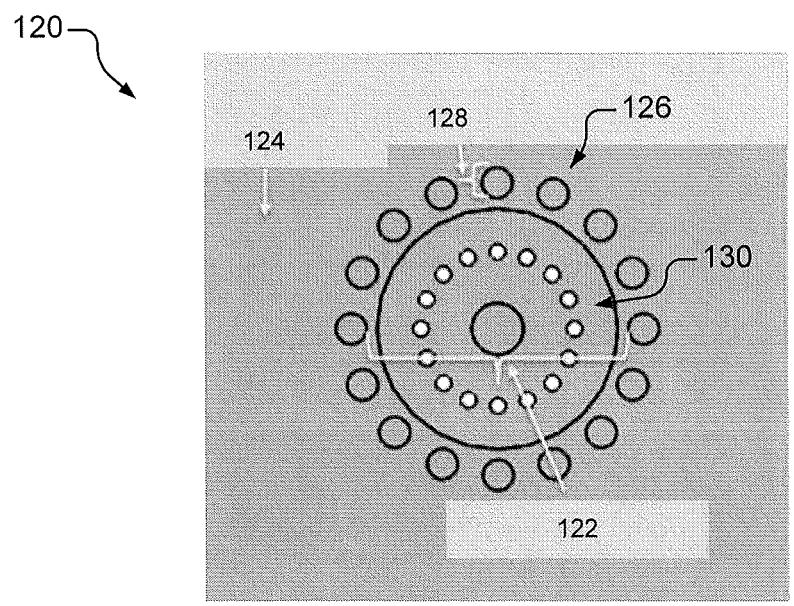
Figure 6B:
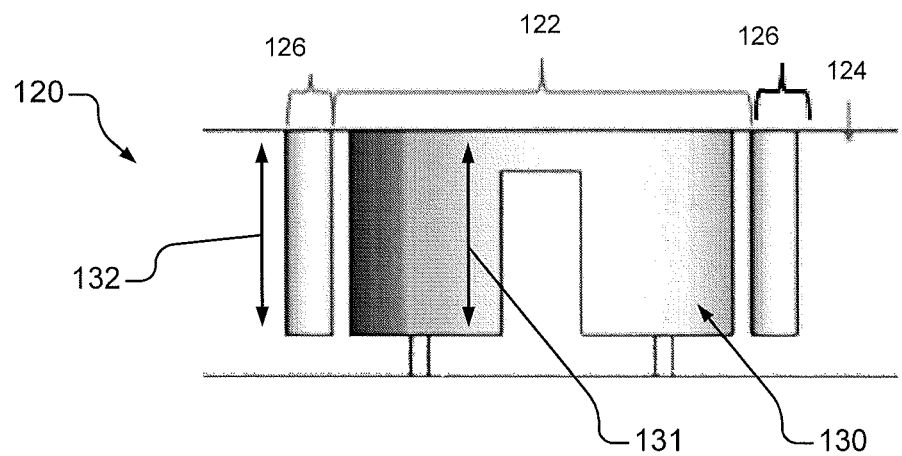

FIGS. 6A-6B illustrate another example thermal control reflow mold, wherein the thermal-isolating region includes a plurality of pockets distributed around the molding region, the pockets having a depth equal to the depth of the cavity of the molding region. FIG. 6A is a top-down view of the thermal control mold, and FIG. 6B is a side-down view of the mold.

Figure 7A:
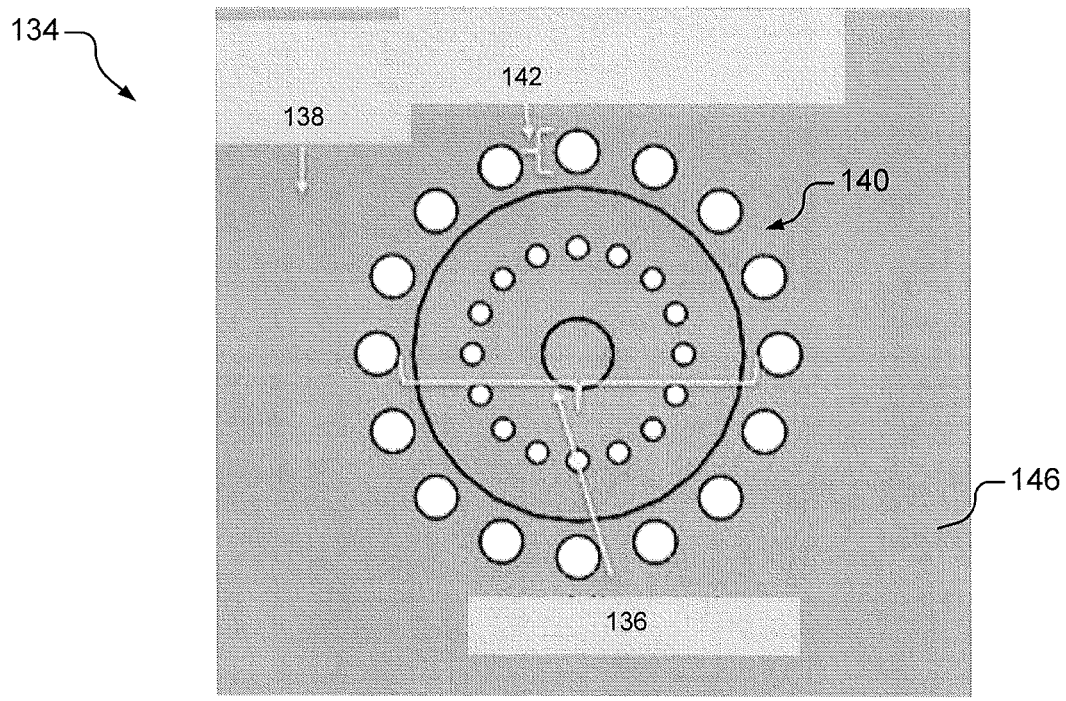
Figure 7B:
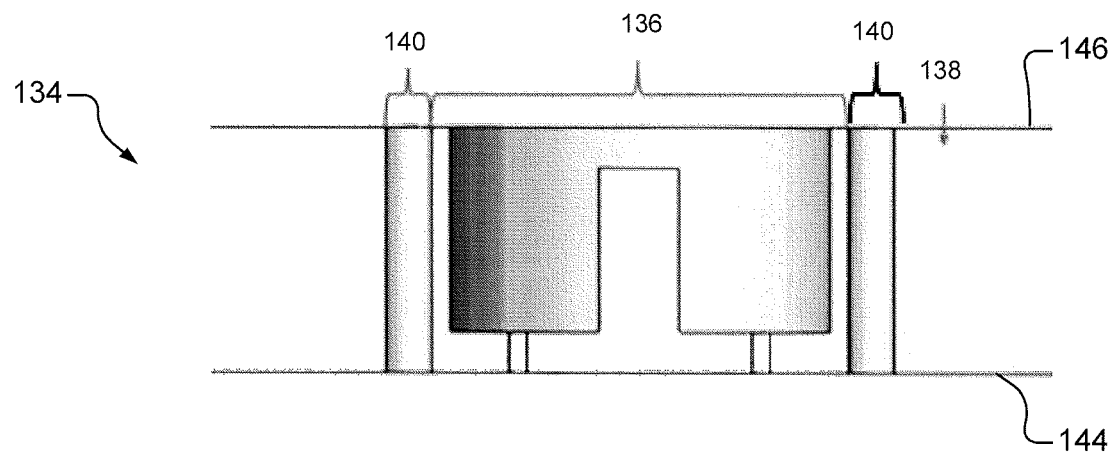

FIGS. 7A-7B illustrate another example thermal control reflow mold, wherein the thermal-isolating region includes a plurality of pockets distributed around the molding region, the pockets extending through a bottom surface of the thermal control reflow mold. FIG. 7A is a top-down view of the thermal control mold, and FIG. 7B is a side-down view of the thermal control reflow mold.

Figure 8A:
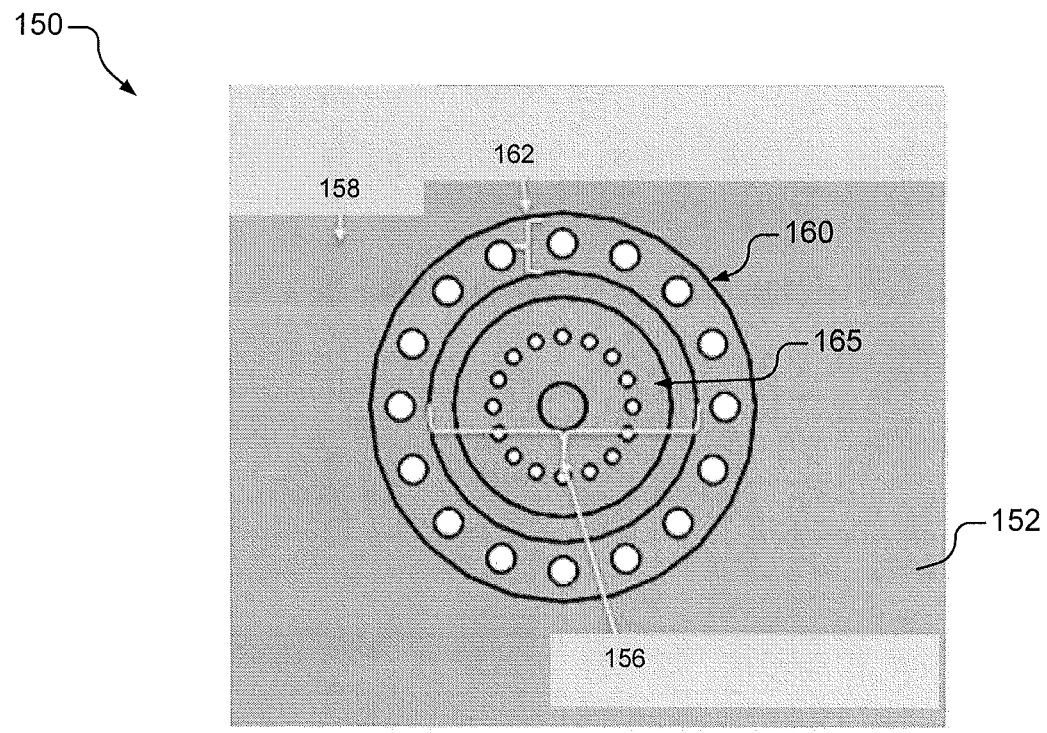
Figure 8B:
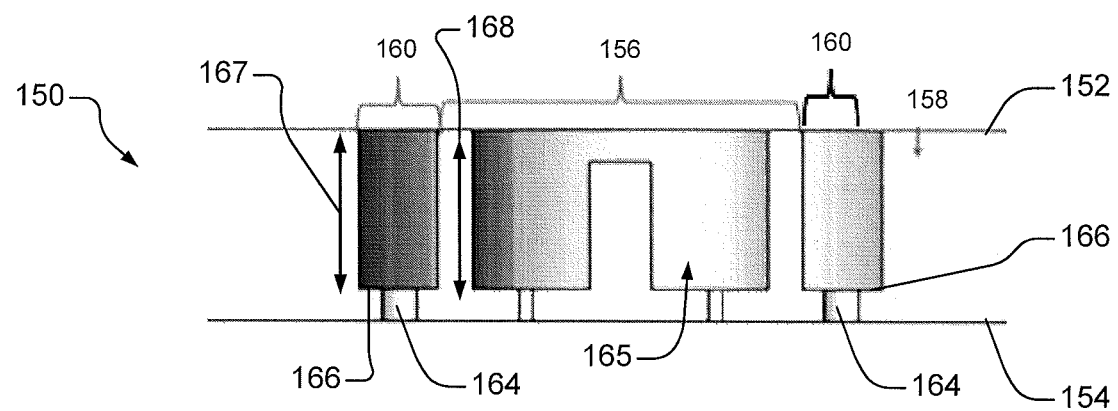

FIGS. 8A-8B illustrate another example thermal control reflow mold, wherein the thermal-isolating region includes a plurality of pockets distributed around the molding region and a through-hole extending from each pocket through a bottom surface the thermal control reflow mold. FIG. 8A is a top-down view of the thermal control mold, and FIG. 8B is a side-down view of the mold.

Figure 9A:
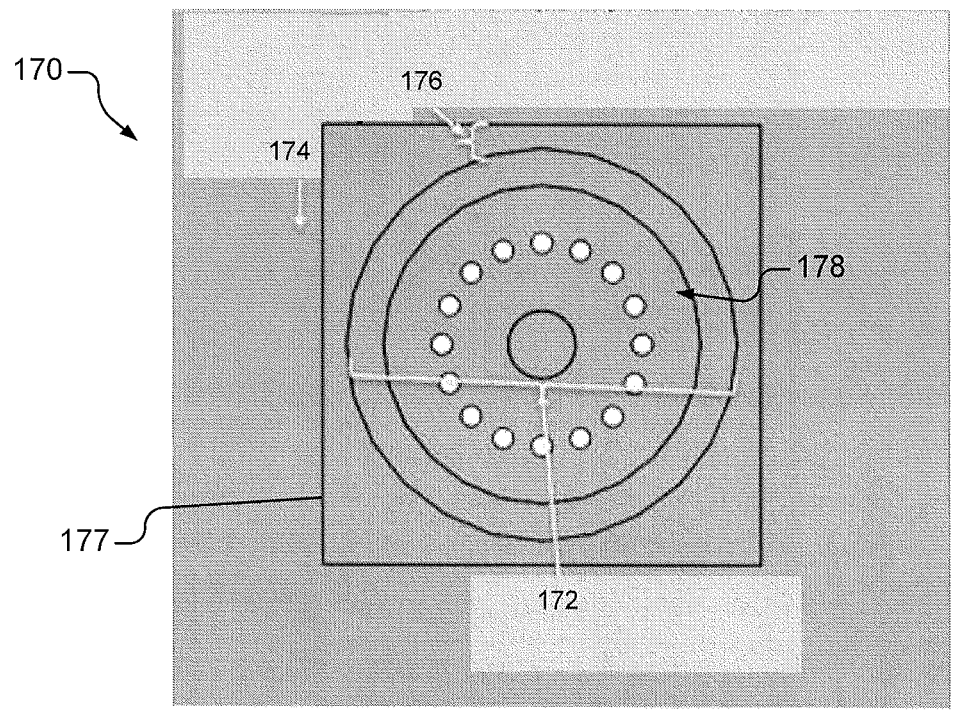
Figure 9B:
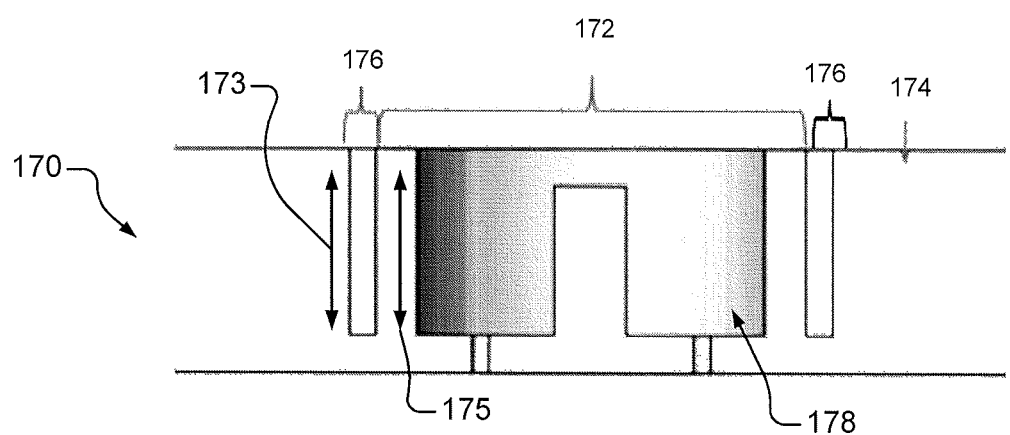

FIGS. 9A-9B illustrate another example thermal control reflow mold, wherein the thermal-isolating region includes a substantially uniformed polygonal-shaped recess around the molding region. FIG. 9A is a top-down view of the thermal control mold, and FIG. 9B is a side-down view of the mold.

Figure 10A:
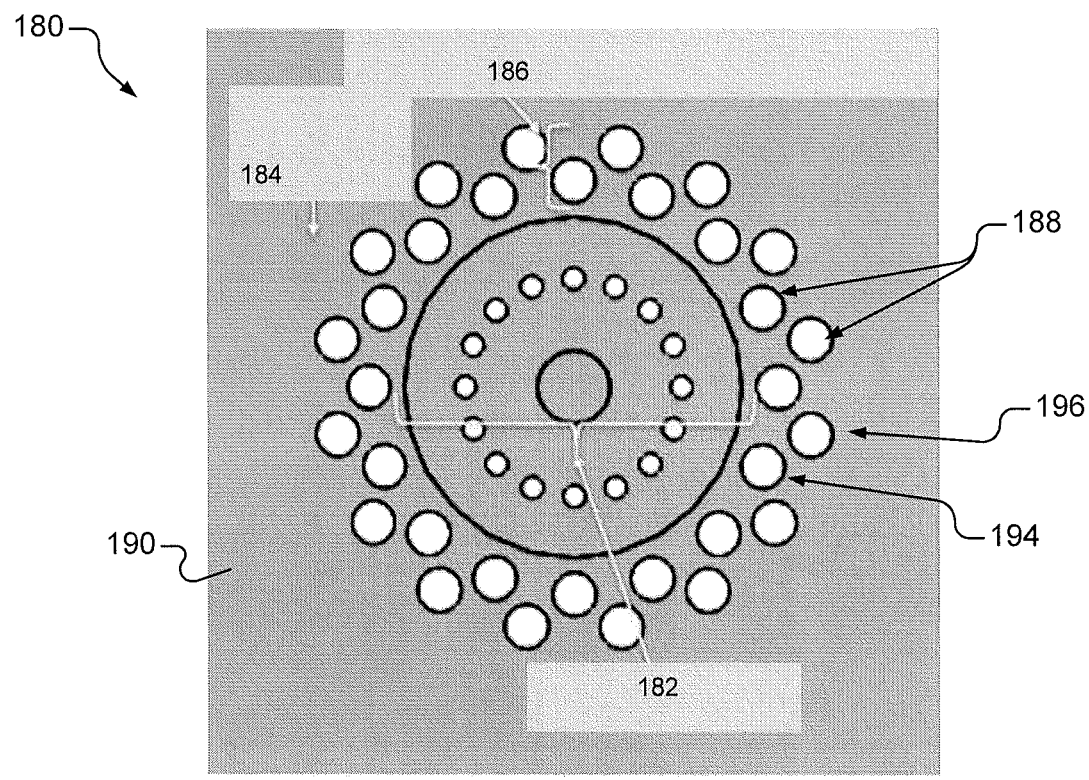
Figure 10B:
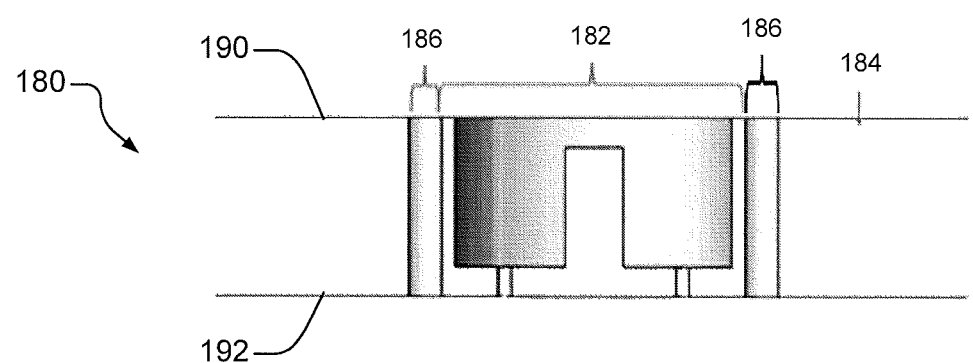

FIGS. 10A-10B illustrate another example thermal control reflow mold, wherein the thermal-isolating region includes an array of interdigitated pockets around the molding region, the interdigitated pockets extending through a bottom surface of the thermal control reflow mold. FIG. 10A is a top-down view of the thermal control mold, and FIG. 10B is a side-down view of the mold.

Corresponding reference numerals indicate corresponding parts throughout the several views of the drawings.

DETAILED DESCRIPTION

The present disclosure will now be described with reference to the accompanying drawings.

The present disclosure provides a mold having substantially complete symmetry and uniformity for low-cost reflow molding of a substrate into a variety of complex three-dimensional (3-D) microstructures. More particularly, the reflow molding process described herein uses a thermal control mold comprising a molding region, a boundary region, and a thermal-isolating region positioned therebetween. In various aspects, the mold may be used for the fabrication of a micro-scale shell resonator having an improved quality factor (Q) for a high-performance vibratory gyroscope. While reference is made throughout this disclosure to gyroscopes, it is understood that the fabrication techniques described herein may be used to construct microstructures for use in a variety of other applications such as RF filters, RF resonators, RF switches, physical sensors and actuators, optical sensors and actuators, chemical sensors, gas sensors, biological sensors and actuators, or combinations thereof.

By way of non-limiting background, FIGS. 1A-1D depict a general reflow molding process for molding a micro-birdbath shell. A detailed description of the depicted reflow molding process is provided in pending U.S. patent application Ser. No. 14/985,859, the disclosure of which is incorporated herein by reference.

Figure 1A:
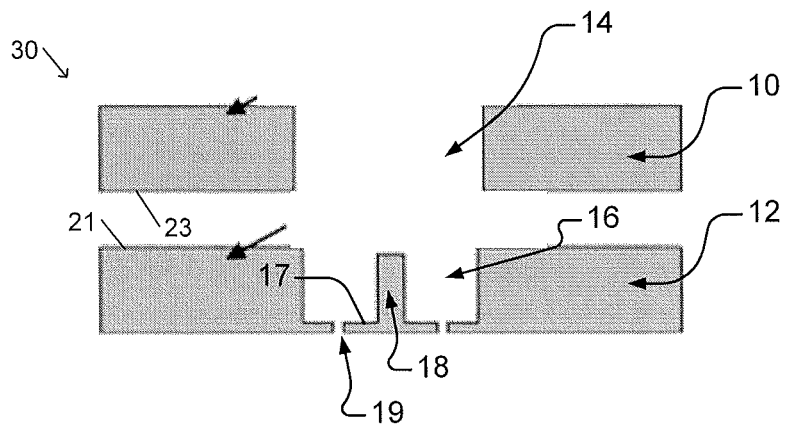
FIGS. 1A-1D illustrate an example reflow molding technique for fabricating three-dimensional microstructures.

FIG. 1A illustrates a mold 30 comprising a top or first mold 10 member or portion and a bottom or second mold 12 member or portion having a first substantially planar surface 21 opposing a first substantially planar surface 23 of the top mold 10. The first and second mold members 10, 12 are formed by machining recesses within substrates and comprise materials having melting temperatures higher than the softening temperature of a substrate material or materials 20 to be reflowed. The top mold 10 has a through-hole 14. The bottom mold 12 has a cylindrical recess or cavity 16, a pillar 18 extending from a bottom surface 17 of the cavity 16, and one or more through-holes 19 defined in the bottom surface 17 of the cavity 16.

Figure 1B:
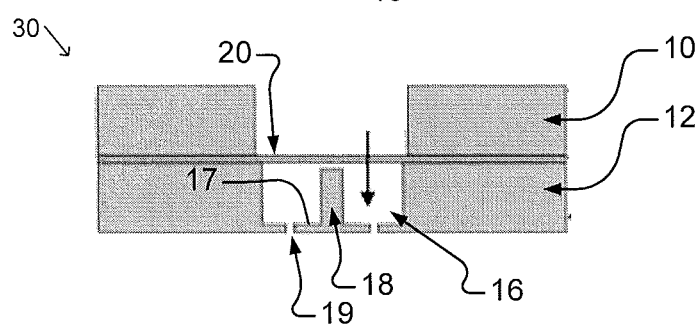

As seen in FIG. 1B, the material or substrate 20 to be reflowed is disposed on the first substantially planar surface 21 of the bottom mold 12 and fixed to the bottom mold member 12 using the top mold 10 to press thereagainst. In other embodiments, the substrate 20 may be fixed to the bottom mold member 12 by applying a vacuum pressure inside the cavity 16 thereby creating a downward pressure on the thermally-reflowable substrate 20. For example, the through-holes 19 may be fluidly coupled to a vacuum that creates a negative pressure between the bottom surface 17 of the cavity 16 and the substrate 20. In such instances, the top mold member 10 may not be needed.

Figure 1C:
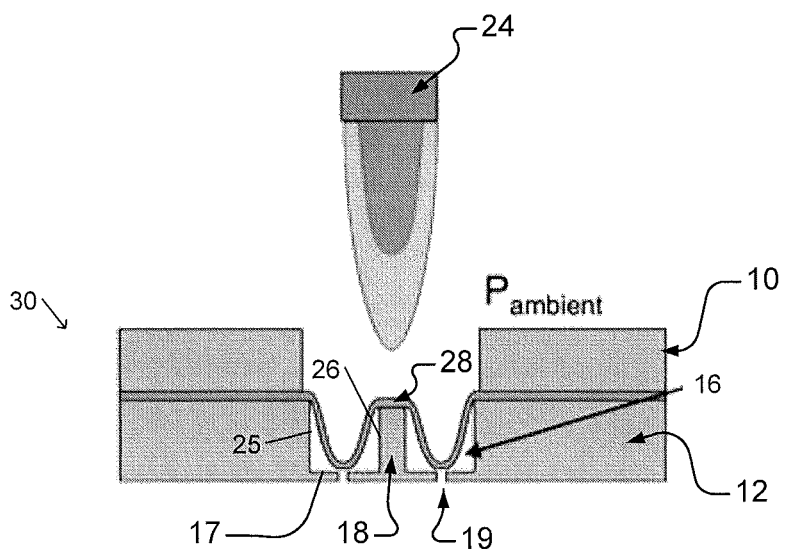
Figure 1D:

As seen in FIG. 1C, a heating source (e.g., fuel-oxygen blowtorch) 24 is used to heat the substrate 20 above its softening temperature. The reflow molding occurs either above the glass transition ($T_g$) for non-crystalline material or above the melting point ($T_M$) of the source material (e.g., quartz) 20. A vacuum pressure is applied inside the cavity 16 between the substrate 20 and the bottom surface 17 of the bottom mold member 12 creating a pressure gradient across the substrate 20. The pressure of the cavity 16 below the substrate 20 ($P_{cavity}$) is made lower than the ambient pressure ($P_{ambient}$) outside the cavity 16. The softened substrate is reflowed down into the cavity 16 and toward the bottom surface 11 of the bottom mold member 12 as a result of the downward pressure gradient generated across the substrate 20. The substrate 20 either partially or negligibly touches the upper corners of the sidewalls 25 forming the cavity 16 and the sidewalls 26 forming the pillar 18. The substrate 20 is deformed into the shape of a birdbath (or a hemi-toroidal) shell 28. As seen in FIG. 1D, the shell 28 is cooled down below the softening temperature and subsequently separated from the molds 10 and 12.

Figure 2A:
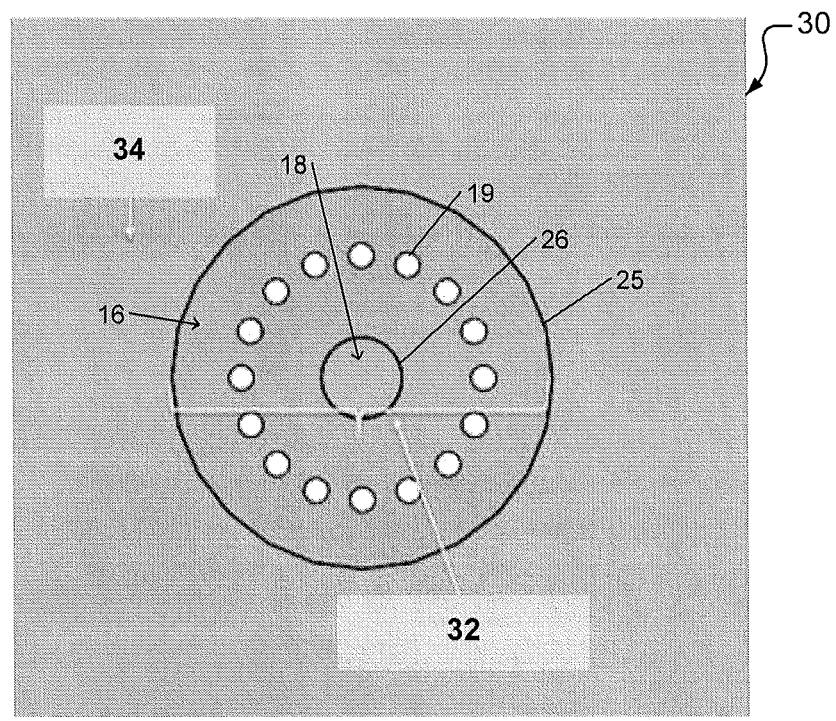
FIGS. 2A-2B illustrate an example reflow mold having a molding region and a boundary region for use in the fabrication of three-dimensional microstructures, for example, in accordance with the processes illustrated in FIGS. 1A-1D.
Figure 2B:
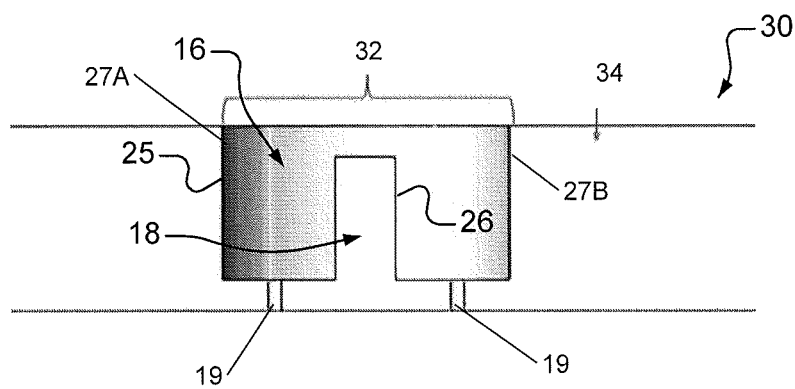

As seen in FIGS. 2A-2B, mold 30 can be divided into two regions: a molding region 32 and a boundary region 34. FIG. 2A illustrates a top view of mold 30, and FIG. 2B illustrates a cross-sectional view of mold 30. Reflow molding takes place in the molding region 32, the hottest part of the mold 30. The molding region 32 includes the middle pillar 18, cavity 16, and through-hole 19 of the bottom mold member 12 and the through-hole 14 of the top mold member 10. The boundary region 34 surrounds the molding region 32 and may have a controlled temperature lower than that of the molding region 32 (e.g., below the softening temperature of the reflow material 20).

The symmetry of a molded shell 28 is affected by both the symmetry and the temperature uniformity of the mold 30. Asymmetry of a mold 30 can be reduced to a negligible level when the mold 30 is made using a precision machining technique, such as micro-milling and a combination of lithography and etching. However, these techniques are prohibitively expensive. Most commonly, the most dominant cause of structural asymmetry is non-uniform temperature distribution near the upper corners 27A and 27B of the sidewalls 25 of the recess 16. The upper corner regions 27A and 27B may touch the substrate 20 and control its local temperatures. Viscosity of a material near its softening temperature strongly depends on temperature and non-uniform temperature distribution at the upper corners 27A and 27B can cause imperfections in the local viscosities of the substrate 20 in this region causing the substrate 20 to deform by different amounts ultimately forming an asymmetrically-shaped shell 28. Further, the corners 27A and 27B of the sidewalls 25 of the mold 30 are located near the rim of the formed birdbath shell resonator 28. The mechanical properties of a shell resonator 28 (e.g., stiffness and damping constants) are dependent on rim geometry because this region has the highest mechanical energy density when a resonator vibrates. Therefore, in order to create a highly symmetric shell 28, it is crucial that the temperatures in the upper corners of the sidewalls of the mold be kept uniform.

The present disclosure uses a thermal control mold comprising a molding region, a boundary region, and a thermal-isolating for low-cost reflow molding of a substrate into a variety of complex three-dimensional (3-D) microstructures. The thermal control reflow mold of the present disclosure optimizes or improves the temperature uniformity and controllability of the reflow molding process. FIGS. 3A-3C illustrates an example thermal control reflow mold 50 for fabricating three-dimensional microstructures (not shown) having a thermal-isolating region 56 disposed between a molding region 52 and a boundary region 54. The thermal control reflow mold 50 has a substantially planar first or top surface 60 opposing a substantially planar second or bottom surface 61.

The molding region 52 is configured to form three-dimensional micro-birdbath shells 69 by reflow molding. However, it is recognized that the molding region 52 of the thermal control reflow mold 50 may take a variety of other shapes. The teachings herein should not be limited to the shape or shapes presently illustrated. In accordance with various aspects of the present disclosure, molding region 52 includes a cavity 58 formed into the top surface 60 of the thermal control reflow mold 50 and a pillar or protrusion 62 formed therewithin. The pillar 62 extends from a bottom surface 64 of the molding region 52 towards the top surface 60 of the thermal control reflow mold 50. One or more through-holes 65 may be formed in the bottom surface 64 of the molding region 52. The molding region 52 is used in conjunction with a heating source 80 to heat and mold a substrate or powder 20 into two or three dimensional microstructures 69 at a temperature above the substrates 20 reflowing temperature.

The thermal-isolating region 56 defines one or more pockets or recesses 66 formed into the top surface 60 of the thermal control reflow mold 50 that increase a distance between the molding region 52 and the boundary region 54 of the thermal control reflow mold 50 and thereby reduces contact between the same. In the present illustration, a pocket 66 extends along a perimeter 72 of the molding region 52 and an interior border 74 of the boundary region 54. However, it is recognized that the thermal-isolating region 56 may take a variety of other shapes, including for example recesses or through-holes having circular, partially circular, polygonal, or partially polygonal top or bottom sides and cross-sections, or a combination thereof. The teachings herein should not be limited to the shape or shapes presently illustrated. In accordance with various aspects of the present disclosure, the thermal-isolating region 56 comprises pocket 66 having a cylindrical or ring shape and that surrounds the molding region 52 forming a cylindrical wall 68 between the pocket 66 and the cavity 58. The boundary region 54 is the region that surrounds the thermal-isolating region 56. The temperature of the boundary region 54 is lower than that of the molding region 52, and the thermal-isolating region 56 controls the thermal conductivity between the molding region 52 and the boundary region 54.

The thermal-isolating region 56 controls the thermal resistance between the molding region 52 and the boundary region 54. More particularly, the thermal resistance within the pocket 66 of the thermal-isolating region 56 is greater than the thermal resistance within the molding region 52. The heat provided by the heat source 80 to the molding region 52 is stored or retained in the molding region 52 and not dissipated to the boundary region 54 because the pocket 66 of the thermal-isolating region 56 effectively divides the thermal masses of the molding region 52 from the boundary region 54. Thus, heat flowing from the molding region 52 into the thermal-isolating region 56 is neutralized allowing the molding region 52 to achieve temperature uniformity when the mold 50 is not heated uniformly.

As seen in FIG. 4A, during the reflow molding process, similar to the reflow molding process illustrated in FIGS. 1A-1D, a substrate 67 is disposed on the first surface 60 of the thermal control reflow mold 50. The disposed substrate 67 extends across the molding region 52, the thermal-isolating region 56, and the boundary region 54. A heat source 80 is subsequently brought close to the molding region 52 and a vacuum pressure applied inside the cavity 58 between the substrate 67 and the bottom surface 64 thereof. The softened substrate 67 reflows down into the cavity 58 toward the bottom surface 64 and deforms into the shape of the thermal control reflow mold 50. The deformed substrate 67 may be trimmed or removed to form the desired final three-dimensional (3-D) microstructure 69.

The symmetry of a shell 69 formed using the thermal control reflow mold 50 is controlled or regulated by the thermal resistance of the thermal-isolating region 56. More particularly, in the example embodiment as seen in FIG. 3B, $R_{anchor}$ is the outer radius of the pillar 62 of the molding region 52. The pillar 62 and molding region each have a cylindrical shape. $R_1$ is the outer radius of the cavity 58 of the molding region 52. The cavity 58 has a cylindrical shape. $R_2$ is the inner radius of thermal-isolating region 56, and $R_3$ is the outer radius of the thermal-isolating region 56. The thermal-isolating region 56 has a ring or cylindrical shape. $D_{recess1}$ is the depth of cavity 58 of the molding region 52, and $D_{recess2}$ is the depth of the pocket 66 of the thermal-isolating region 56. As seen in FIG. 4A, the geometry of the shell 69 is determined by the $R_1$ and $R_{anchor}$, while the symmetry of the shell is controlled by the thermal resistance of the thermal-isolating region 56. The thermal resistance of the thermal-isolating region 56 is proportional to $$\frac{R_3 - R_2}{T - D_{recess2}},$$

where T is the thickness of the thermal control reflow mold 50. The thermal mass of the molding region 52 is proportional to $(R_2-R_1) \times D_{recess1}$ and $(R_2-R_1) \times D_{recess2}$. Thus, the dimensions and symmetry of the reflow-molded shell 69 can be independently controlled.

The temperature distribution and heat flow characteristics of thermal control reflow mold 50 can be further characterized using an equivalent electrical circuit model. For example, as seen in FIG. 4A, the heat source 80 may be a blowtorch 81 having an imperfect temperature distribution profile and modeled as a perfect single-point heat source misaligned from the center of the mold 50. It is recognized that a variety of other heat sources 80 may be employed in conjunction with the present disclosure, including for example only fuel-oxygen blowtorch, plasma torch, laser heating, resistive heating, induction heating, or combinations thereof. The blowtorch 81 discussion herein is understood to be illustrative and not limiting of the potential heat sources 80.

The misalignment between the heat source 80 and the center of the mold 50 is modeled using two resistors ($R_{AirR}$ and $R_{AirL}$) between the blowtorch 81 and the opposing upper corners 70A and 70B of the cylindrical walls 68. $R_{AirR}$ and $R_{AirL}$ are inversely proportional to the distance between the blowtorch 81 and respective mold 50 regions. The blowtorch 80 is modeled as a DC voltage source having a voltage $V_{Blowtorch}$. The thermal resistance between the molding region 52 and the thermal-isolating region 56 is modeled as $R_{Mold-Isolate}$ and the thermal mass between the molding region 52 and the thermal-isolating region 56 is modeled as $C_{Mold-Isolate}$. $R_{Mold-Isolate}$ is inversely proportional to the thickness of the cylindrical wall 68 and proportional to the height of the cylindrical wall 68

$$\left( \propto \frac{D_{recess1}}{R_2 - R_1} \text{ and } \frac{D_{recess2}}{R_2 - R_1} \right).$$

$C_{Mold-Isolate}$ is proportional to the mass of the cylindrical wall 68 ($\geq (R_2-R_1) \times D_{recess1}$ and $(R_2-R_1) \times D_{recess2}$). The thermal resistance between the opposing upper corners 70A and 70B of the cylindrical wall 68 is modeled as $R_{Mold-Mold}$ and the thermal mass between the upper corners 70A and 70B of the cylindrical wall 68 is modeled as $C_{Mold-Mold}$. $R_{Mold-Mold}$ is proportional to the average radius of the cylindrical wall 68 and inversely proportional to thickness and height (e.g., $D_{recess1}$; $D_{recess2}$) of the cylindrical wall 68

$$\left( \propto \frac{R_1 + R_2}{(R_2 - R_1)D_{recess1}} \text{ and } \frac{R_1 + R_2}{(R_2 - R_1)D_{recess2}} \right).$$

$C_{Mold-Mold}$ is proportional to the mass of the cylindrical wall 68 ($\propto (R_2-R_1) \times D_{recess1}$ and $(R_2-R_1) \times D_{recess2}$). The thermal resistance between the molding region 52 and the boundary region 54 is modeled as $R_{isolate}$. $R_{isolate}$ is proportional to the width and inversely proportional to a bridge between the molding region 52 and the boundary region 54

$$\left( \propto \frac{R_3 - R_2}{T - D_{recess2}} \right).$$

FIG. 4B illustrates the electrical circuitry of the equivalent electrical components of FIG. 4A. The voltage of nodes $V_{Mold\_R}$ and $V_{Mold\_L}$ represent the temperatures of the respective corners 70A and 70B of the cylindrical wall 68. The non-uniformity in temperature in these regions is proportional to $V_{Mold\_R} V_{Mold\_L}$. The current that flowing from the DC source, voltage $V_{Blowtorch}$ (=$i_{Blowtorch}$), is proportional to the total amount of heat provided by the blowtorch 80.

Table 1 below summarizes the equivalent electrical components and relationship of the components to the physical parameters of the blowtorch molding setup of FIG. 4A.

TABLE 1

Summarizing Table of Electrical Components

| Parameter | Equivalent Circuit Representation | Relationship to Physical Dimensions |
|---|---|---|
| Temperature of blowtorch | $V_{Blowtorch}$ | $\propto$ Temperature of blowtorch |
| Thermal resistance between blowtorch and upper right corner of wall | $R_{AirR}$ | $\propto$ (Distance between the blowtorch 81 and the upper corner 70B of the cylindrical wall 68)$^{-1}$ |
| Thermal resistance between blowtorch and upper left corner of wall | $R_{AirL}$ | $\propto$ (Distance between the blowtorch 81 and the uppercorner 70A of the cylindrical wall 68)$^{-1}$ |
| Thermal resistance between molding region to thermal-isolating region | $R_{Mold\text{-}Isolate}$ | $\propto D_{recess1}/(R_2 - R_1)$ & $D_{recess2}/(R_2 - R_1)$ |
| Thermal mass between molding region to thermal-isolating region | $C_{Mold\text{-}Isolate}$ | $\propto (R_2 - R_1) \times D_{recess1}$ & $(R_2 - R_1) \times D_{recess2}$ |
| Thermal resistance between the two upper corners of the wall | $R_{Mold\text{-}Mold}$ | $\propto \dfrac{R_1 + R_2}{(R_2 - R_1)D_{recess1}}$ & $\dfrac{R_1 + R_2}{(R_2 - R_1)D_{recess2}}$ |
| Thermal capacitance between the two upper corners of the wall | $C_{Mold\text{-}Mold}$ | $\propto (R_2 - R_1) \times D_{recess1}$ & $(R_2 - R_1) \times D_{recess2}$ |
| Thermal resistance between molding and boundary regions | $R_{Isolate}$ | $\propto (R_3 - R_2)/(T - D_{recess2})$ |

When a mold is heated uniformly, the same amount of heat is provided from the blowtorch 81 to both upper corners 70A and 70B of the cylindrical wall 68 and $R_{AirR} = R_{AirL}$. When a mold 50 is perfectly symmetrical, $R_{Mold\text{-}Isolate}$, $C_{Mold\text{-}Isolate}$, and $R_{Mold\text{-}Isolate}$ connected to both the upper corner 70B of the cylindrical wall 68 (i.e., node R) and the upper corner 70A of the cylindrical wall 68 (i.e., node L) are the same and $V_{Mold\_R} = V_{Mold\_L}$. The temperatures of the opposing upper corners 70A and 70B are the same and the shell 69 formed using reflow molding can have perfect symmetry.

Typically, however the mold 50 is heated non-uniformly and different amounts of heat arrive from the blowtorch 81 to the upper corners 70A and 70B of cylindrical wall 68 and $R_{AirR} \neq R_{AirL}$. An approximate solution for $|V_{Mold\_R} - V_{Mold\_L}|$ is found to be:

$$|V_{Mold\_R} - V_{Mold\_L}| \approx \frac{|R_{AirR} - R_{AirL}|V_{Blowtorch}}{(R_{Mold-Isolate} + R_{Isolate})}$$

Thus, for a given $|R_{AirR} - R_{AirL}|$, a smaller $|V_{Mold\_R} - V_{Mold\_L}|$ can be achieved by increasing $R_{Mold\text{-}Isolate} + R_{isolate}$. More particularly, as $R_{Mold\text{-}Isolate} + R_{isolate}$ increases it becomes increasingly easier for electrical current to flow from Node R to Node L or vice versa if there is a voltage difference between these nodes. The current that flows across the nodes reduces the voltage difference. In other words, when the thermal resistance at the thermal-isolating region 56 ($R_{Mold\text{-}Isolate}$) is raised more heat flows across locally hot regions to locally cold regions within the molding region 52 to neutralize the temperatures differences.

The geometry of the thermal control reflow mold 50 controls the geometry of the reflow-molded shell 69 and the rigidity and durability of the thermal control reflow mold 50. Increases in the thermal resistance of the thermal isolating region 56 and reductions in the mass of the molding region 52 improve the structural symmetry of the reflow-molded shell 69. Reductions in the mass of the molding region 52 improve the structural symmetry of the reflow-mold shell 69 by decreasing the time required to reach a steady-state temperature value. Thus, the improved symmetry of the reflow-molded shell 69 occurs when $[(R_3-R_2)/(T-D_{recess2})]$ increases and $[(R_2-R_1) \times D_{recess1}]$ or $[(R_2-R_1) \times D_{recess2}]$ decreases.

The height of a reflow-molded shell 69, when under a same applied heat, pressure gradient, and molding duration, decreases as the thermal resistance of the thermal-isolating region 56 increases (e.g., $\propto(R_3-R_2)/(T-D_{recess2})$) and the mass of the molding region 52 decreases (e.g., $\propto[(R_2-R_1) \times D_{recess1}]$ and $[(R_2-R_1) \times D_{recess2}]$) because the temperature of the molding region 52 reaches a temperature that is closer to the temperature of the reflow-molded substrate 67. Conversely, the temperature of a reflow-molded substrate near a molding region is generally higher than the temperature of the molding region of the mold because the substrate is located closer to the heat source. As the temperature difference between the reflow-molding substrate 67 and the molding region 52 decreases, the substrate 67 reflows at a closer distance to the molding region 52 because the amount of thermal energy transferred from the reflow-molding substrate 37 to the molding region 52 through thermal conduction, convection, and radiation decreases. The temperature of the reflow-molding substrate 67 is maintained above its glass transition temperature when the substrate 67 reflows closer to the molding region 52. As a result the amount of friction between the shell 69 and the mold 50 increases and the height of the shell 69 decreases. The height of the shell 69 may be increased by increasing the amount of heat applied by the heat source 80, the pressure gradient across the shell 69, and the duration of reflow molding. However, the applied heat need be maintained so the substrate 67 does not become uncontrollably soft and the pressure gradient maintained so the shell 69 is not inadvertently deformed.

The rigidity and durability of the mold 50 decreases with an increase in the thermal resistance of the thermal-isolating region 56 and a decrease in the mass of the molding region 52 (e.g., $(\propto [(R_2-R_1) \times D_{recess1}]$ and $[(R_2-R_1) \times D_{recess2}])$. For a mold comprising graphite having a particle size of less than 100 μm, geometrical parameters of the mold can result in a tall, symmetric shell where $[(R_3-R_2)/(T-D_{recess2})]$ is equal to about 0.001-100 and $[(R_2-R_1)/D_{recess1}]$ or $[(R_2-R_1)/D_{recess2}]$ are equal to about 0.001-100.

While mold 50 illustrated in FIGS. 3A-4A is configured to form one shell 69, a mold 100 can have a plurality of sub-mold patterns 102 for reflow molding multiple shells (not shown). For example, FIG. 5 illustrates a mold 100 comprising a plurality of sub-mold patterns 102 each having a molding region 104, a boundary region 106, and a thermal-isolating region 108 disposed therebetween as described above. In various aspects, the mold 100 may create multiple shells simultaneously from a single substrate that extends across the sub-mold patterns 102.

As noted above, the thermal-isolating region (e.g., 56, 108) may take a variety of configurations. The configuration of the thermal-isolating region including recesses therein controls or regulates the thermal conductivity between the molding region (e.g. 52, 104) and boundary region (e.g., 54, 106).

For example, FIGS. 6A-6B illustrate a thermal control reflow mold 120 comprising a molding region 122, a boundary region 124, and a thermal-isolating region 126 disposed therebetween. The thermal-isolating region 126 has an array of pockets or circular recesses 128 evenly distributed around the molding region 122. The pockets 128 of the thermal-isolating region 126 have a first depth 132 substantially equal to a second depth 131 of the cavity 130 of the molding region 122.

FIGS. 7A-7B illustrate a thermal control reflow mold 134 having a first or top surface 146 opposing a second or bottom surface 144 and comprising a molding region 136, a boundary region 138, and thermal-isolating region 140 disposed therebetween. The thermal-isolating region 140 has an array of pockets 142 evenly distributed to surround the molding region 136 that extend through the bottom or base surface 144 of the thermal control reflow mold 134.

FIGS. 8A-8B illustrate a thermal control reflow mold 150 having a first or top surface 152 opposing a second or bottom surface 154 and comprising a molding region 156, a boundary region 158, and a thermal-isolating region 160 disposed therebetween. The thermal-isolating region 160 has an array of pockets 162 evenly distributed to surround the molding region 156. Each pocket 162 has a first depth 167 substantially equal to a second depth 168 of a cavity 165 of the molding region 156. The thermal-isolating region 160 further includes a through-hole 164 extending from a base or bottom surface 166 of the pocket 162 through the bottom surface 154 of the mold 150.

FIGS. 9A-9B illustrate a thermal control reflow mold 170 comprising a molding region 172, a boundary region 174, and a thermal-isolating region 176 disposed therebetween. The thermal-isolating region 176 comprises a substantially uniformed polygonal-shaped recess or pocket 177 that surrounds the molding region 156. The polygonal-shaped pocket 177 has a first depth 173 substantially equal to a second depth 175 of a cavity 178 of the molding region 172.

FIGS. 10A-10B illustrate a thermal control reflow mold 180 having a first or top surface 190 opposing a second or bottom surface 192 and comprising a molding region 182, a boundary region 184, and a thermal-isolating region 186 disposed therebetween. The thermal-isolating region 186 has an array of interdigitated pockets 188 that extend through the bottom surface 192 of the mold. The pockets 188 are arranged to form a first surrounding region 194 and a second surrounding region 196. The first surrounding region 194 is positioned between the molding region 182 and the second surrounding region 196.

In each example embodiment, the thermal control reflow molds of the present disclosure have a thermal-isolating region configured to control the thermal resistance across the molding region (e.g., a region where reflow molding takes place) and the boundary region (e.g., a region whose temperature is kept lower than that of the molding region). The thermal resistance in the thermal-isolating region is high to prevent heat dissipation from the molding region to the boundary region. Specifically, the thermal-isolating region forms a barrier to store a large amount of heat within the molding region and to neutralize the temperature within the molding region. The molding region therefore obtains high temperature uniformity when the mold is heated non-uniformly. Also, the thermal-isolating region controls the thermal mass of the molding region, such that the thermal mass is lowered to reduce the thermal response time of the molding region, thus improving the temperature controllability of the molding region.

The thermal control reflow mold design of the present disclosure can be used to create a wide variety of three-dimensional microstructures.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth, such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail.

The terminology used herein is for the purpose of describing particular example embodiments only, and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers, and/or sections, these elements, components, regions, layers, and/or sections should not be limited by these terms. These terms may only be used to distinguish one element, component, region, layer, or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations), and the spatially relative descriptors used herein interpreted accordingly.

What is claimed is:

1. A method for fabricating three-dimensional microstructures, the method comprising:

disposing a substantially planar reflow material on a mold having a molding region, a boundary region, and a thermal-isolating region disposed therebetween, wherein the molding region includes a cavity formed therein and a protrusion projecting upwards from a bottom surface of the cavity and the thermal-isolating region includes at least one pocket formed adjacent to and along a perimeter of the cavity of the molding region, wherein a thermal resistance of the thermal-isolating region is proportional to $$\frac{R_3 - R_2}{T - D_{recess2}},$$

where $R_3$ is an outer radius of the thermal-isolating region, $R_2$ is an inner radius of thermal-isolating region, T is a thickness of the mold, and $D_{recess2}$ is a depth of the at least one pocket of the thermal-isolating region, and the mold has a geometrical relationship defined by two or more of $[(R_3-R_2)/(T-D_{recess2})]$, $[(R_2-R_1)/D_{recess1}]$, and $[(R_2-R_1)/D_{recess2}]$, where $R_1$ is an outer radius of the cavity of the molding region and $D_{recess1}$ is a depth of the cavity of the molding region, wherein T and $D_{recess1}$ are different;

heating the reflow material while the reflow material is disposed on the mold, wherein a thermal resistance within the at least one pocket of the thermal-isolating region is greater than a thermal resistance of the molding region, and wherein the molding region has a first temperature higher than a second temperature of the boundary region and the thermal-isolating region divides thermal masses of the molding region and the boundary region; and reflowing the reflow material towards the bottom surface of the cavity by creating a pressure gradient across the reflow material, whereby the protrusion extending from the bottom surface of the cavity helps to shape the reflow material and thereby form a three-dimensional microstructure.

2. The method of claim 1, wherein the three-dimensional microstructure has a diameter equal to or less than about 120 cm.

3. The method of claim 1, wherein the thermal mass of the molding region is proportional to $[(R_2-R_1) \times D_{recess1}]$ and $[(R_2-R_1) \times D_{recess2}]$.

4. The method of claim 3, wherein the thermal mass of the molding region is proportional to a thermal response time of the molding region.

5. The method of claim 1, wherein the at least one pocket of the thermal-isolating region is a ring shaped recess that surrounds the cavity of the molding region, wherein the ring shaped recess has a first depth that is substantially equal to a second depth of the cavity.

6. The method of claim 1, wherein the at least one pocket of the thermal-isolating region has a first base surface at a first depth that is substantially equal to a second depth of the cavity and at least one through-hole extending through the first base surface and a second base surface of the mold.

7. The method of claim 1, wherein the at least one pocket of the thermal-isolating region includes an array of pockets that are distributed in a substantially uniformed manner around the cavity of the molding region.

8. The method of claim 1, wherein the at least one pocket of the thermal-isolating region includes an array of interdigitated pockets that are distributed in a substantially uniformed manner around the cavity of the molding region.

9. The method of claim 1, wherein the at least one pocket of the thermal-isolating region extends through a base surface of the mold.

10. The method of claim 1, further comprising controlling the pressure gradient across the reflow material independently from the heating of the reflow material, wherein at least one through-hole extends from the bottom surface of the cavity through a base surface of the mold and the method further includes fluidly coupling the at least one through-hole to a pressure source.

11. A method for fabricating three-dimensional microstructures, the method comprising:

disposing a substantially planar reflow material on a mold having a molding region, a boundary region, and a thermal-isolating region disposed therebetween, wherein the molding region includes a cavity formed therein and a protrusion projecting upwards from a bottom surface of the cavity and the thermal-isolating region includes at least one pocket formed adjacent to and along a perimeter of the cavity of the molding region, wherein a thermal resistance of the thermal-isolating region is proportional to $$\frac{R_3 - R_2}{T - D_{recess2}},$$

where $R_3$ is an outer radius of the thermal-isolating region, $R_2$ is an inner radius of thermal-isolating region, T is a thickness of the mold, and $D_{recess2}$ is a depth of the at least one pocket of the thermal-isolating region, and the mold has a geometrical relationship defined by one or more of $[(R_3-R_2)/(T-D_{recess2})]$, $[(R_2-R_1)/D_{recess1}]$, and $[(R_2-R_1)/D_{recess2}]$, where $R_1$ is an outer radius of the cavity of the molding region and Drecess1 is a depth of the cavity of the molding region;

heating the reflow material while the reflow material is disposed on the mold, wherein the molding region has a first temperature at or greater than the softening temperature of the reflow material and the boundary region has a second temperature less than the softening temperature of the reflow material and the thermal-isolating region divides thermal masses of the molding region and the boundary region; and reflowing the reflow material towards the bottom surface of the cavity by creating a pressure gradient across the reflow material, whereby the protrusion extending from the bottom surface of the cavity helps to shape the reflow material and thereby form a three-dimensional microstructure and the reflow material does not flow into the at least one pocket of the thermal-isolating region.

12. The method of claim 11, wherein the at least one pocket of the thermal-isolating region is a ring shaped recess that surrounds the cavity of the molding region, wherein the ring shaped recess has a first depth that is substantially equal to a second depth of the cavity.

13. The method of claim 11, wherein the at least one pocket of the thermal-isolating region has a first base surface at a first depth that is substantially equal to a second depth of the cavity and at least one through-hole extending through the first base surface and a second base surface of the mold.

14. The method of claim 11, wherein the at least one pocket of the thermal-isolating region includes an array of pockets that are distributed in a substantially uniformed manner around the cavity of the molding region.

15. The method of claim 11, wherein the at least one pocket of the thermal-isolating region extends through a base surface of the mold.

16. The method of claim 11, further comprising controlling the pressure gradient across the reflow material independently from the heating of the reflow material, wherein at least one through-hole extends from the bottom surface of the cavity through a base surface of the mold and the method further includes fluidly coupling the at least one through-hole to a pressure source.

17. A method for fabricating three-dimensional microstructures, the method comprising:

disposing a substantially planar reflow material on a mold having a molding region, a boundary region, and a thermal-isolating region disposed therebetween, wherein the molding region includes a cavity formed therein and a protrusion projecting upwards from a bottom surface of the cavity and the thermal-isolating region includes at least one pocket formed adjacent to and along a perimeter of the cavity of the molding region, wherein the at least one pocket of the thermal-isolating region is free from a through-hole extending therefrom, wherein a thermal resistance of the thermal-isolating region is proportional to $$\frac{R3 - R2}{T - D_{recess2}},$$

where $R_3$ is an outer radius of the thermal-isolating region, $R_2$ is an inner radius of thermal-isolating region, T is a thickness of the mold, and $D_{recess2}$ is a depth of the at least one pocket of the thermal-isolating region, and the mold has a geometrical relationship defined by one or more of $[(R_3-R_2)/(T-D_{recess2})]$, $[(R_2-R_1)/D_{recess1}]$, and $[(R_2-R_1)/D_{recess2}]$, where $R_1$ is an outer radius of the cavity of the molding region and $D_{recess1}$ is a depth of the cavity of the molding region, wherein T and $D_{recess1}$ are different and wherein T and $D_{recess2}$ are different;

heating the reflow material while the reflow material is disposed on the mold, wherein the molding region has a first temperature higher than a second temperature of the boundary region and the thermal-isolating region divides thermal masses of the molding region and the boundary region; and reflowing the reflow material towards the bottom surface of the cavity by creating a pressure gradient across the reflow material, whereby the protrusion extending from the bottom surface of the cavity helps to shape the reflow material and thereby form a three-dimensional microstructure.

18. The method of claim 17, further comprising controlling the pressure gradient across the reflow material independently from the heating of the reflow material, wherein at least one through-hole extends from the bottom surface of the cavity through a base surface of the mold and the method further includes fluidly coupling the at least one through-hole to a pressure source.

19. The method of claim 17, wherein the at least one pocket of the thermal-isolating region is a ring shaped recess that surrounds the cavity of the molding region, wherein the ring shaped recess has a first depth that is substantially equal to a second depth of the cavity.

20. The method of claim 17, wherein the at least one pocket of the thermal-isolating region includes an array of pockets that are distributed in a substantially uniformed manner around the cavity of the molding region.

* * * * *